(12) United States Patent
Shifren

(10) Patent No.: US 11,183,998 B2
(45) Date of Patent: Nov. 23, 2021

(54) CORRELATED ELECTRON SWITCH

(71) Applicant: Cerfe Labs, Inc., Austin, TX (US)

(72) Inventor: Lucian Shifren, San Jose, CA (US)

(73) Assignee: Cerfe Labs, Inc., Austin, TX (US)

( * ) Notice: Subject to any disclaimer, the term of this patent is extended or adjusted under 35 U.S.C. 154(b) by 0 days.

(21) Appl. No.: 15/659,288

(22) Filed: Jul. 25, 2017

(65) Prior Publication Data

US 2018/0026621 A1 Jan. 25, 2018

Related U.S. Application Data

(63) Continuation of application No. 14/815,054, filed on Jul. 31, 2015, now Pat. No. 9,735,766.

(51) Int. Cl.
| | |
|---|---|
| *H03L 5/00* | (2006.01) |
| *H03K 17/041* | (2006.01) |
| *G11C 13/00* | (2006.01) |
| *H01L 45/00* | (2006.01) |
| *H03K 17/567* | (2006.01) |
| *H03K 19/20* | (2006.01) |
| *H03H 11/12* | (2006.01) |

(52) U.S. Cl.
CPC ......... *H03K 17/041* (2013.01); *G11C 13/004* (2013.01); *G11C 13/0007* (2013.01); *G11C 13/0069* (2013.01); *G11C 13/0097* (2013.01); *H01L 45/04* (2013.01); *H01L 45/146* (2013.01); *H01L 45/147* (2013.01); *H03K 17/567* (2013.01); *H03K 19/20* (2013.01); *G11C 13/003* (2013.01); *G11C 2013/009* (2013.01); *G11C 2213/74* (2013.01); *G11C 2213/79* (2013.01); *H03H 11/126* (2013.01); *H03H 11/1291* (2013.01)

(58) Field of Classification Search
CPC .... H03H 11/245; H03H 11/24; H03K 17/693; H03G 1/0088; H03G 1/007
USPC ........................................................ 327/308
See application file for complete search history.

(56) References Cited

U.S. PATENT DOCUMENTS

| | | | |
|---|---|---|---|
| 7,298,640 | B2 | 11/2007 | Chen et al. |
| 7,639,523 | B2 | 12/2009 | Celinska et al. |
| 7,778,063 | B2 | 8/2010 | Brubaker et al. |
| 7,872,900 | B2 | 1/2011 | Paz de Araujo et al. |
| 8,045,364 | B2 | 10/2011 | Schloss |
| 8,125,021 | B2 | 2/2012 | Cho et al. |
| 8,295,074 | B2 | 10/2012 | Yasuda |
| 9,318,531 | B1 * | 4/2016 | Mathur ................. H01L 45/16 |
| 9,735,766 | B2 | 8/2017 | Shifren |

(Continued)

FOREIGN PATENT DOCUMENTS

| | | |
|---|---|---|
| JP | 2008530815 A | 8/2008 |
| JP | 2010522424 A | 7/2010 |

(Continued)

OTHER PUBLICATIONS

Inoue, Isao H. et al., "Strong electron correlation effects in non-volatile electronic memory devices", IEEE, 2005, pp. 131-136.

(Continued)

*Primary Examiner* — Quan Tra
(74) *Attorney, Agent, or Firm* — Berkeley Law & Technology Group, LLP

(57) ABSTRACT

Subject matter disclosed herein may relate to correlated electron switches.

18 Claims, 13 Drawing Sheets

(56) References Cited

U.S. PATENT DOCUMENTS

| | | | |
|---|---|---|---|
| 2007/0217252 A1 | 9/2007 | Symanczyk | |
| 2008/0107801 A1* | 5/2008 | Celinska | H01L 45/04 |
| | | | 427/96.7 |
| 2009/0250678 A1 | 10/2009 | Osano | |
| 2010/0226163 A1* | 9/2010 | Savransky | G11C 13/0004 |
| | | | 365/148 |
| 2012/0051127 A1* | 3/2012 | Yoon | G11C 13/004 |
| | | | 365/163 |
| 2013/0215673 A1* | 8/2013 | Zhou | G11C 11/161 |
| | | | 365/158 |
| 2013/0285699 A1 | 10/2013 | McWillimas et al. | |

FOREIGN PATENT DOCUMENTS

| | | |
|---|---|---|
| JP | 2020522424 A | 7/2020 |
| WO | 2006/088323 A1 | 8/2006 |
| WO | 2006088323 A1 | 8/2006 |
| WO | 2006/098560 A1 | 9/2006 |
| WO | 2006098560 A1 | 9/2006 |
| WO | 2007138646 A1 | 12/2007 |
| WO | 2008/058264 A2 | 5/2008 |
| WO | 2008/058264 A3 | 5/2008 |
| WO | 2008054055 A1 | 5/2008 |
| WO | 2008058264 A2 | 5/2008 |
| WO | 2008/054055 A1 | 8/2008 |

OTHER PUBLICATIONS

Celinska, Jolanta et al., "Material and process optimization of correlated electron random access memories", Journal of Applied Physics 109, 091603, 2011, 7 pages.
PCT/GB2016/052365, International Search Report and Written Opinion, dated Oct. 20, 2016, 19 pages.
U.S. Appl. No. 14/815,054, filed Jul. 31, 2015, 75 pages.
U.S. Appl. No. 14/815,054: Application Data Sheet, Aug. 6, 2015, 7 pages.
U.S. Appl. No. 14/815,054: Filing Receipt, Aug. 17, 2015, 3 pages.
U.S. Appl. No. 14/815,054: Non-Final Rejection, dated Aug. 16, 2016, 12 pages.
U.S. Appl. No. 14/815,054: Amendment/Req. Reconsideration-After Non-Final Reject, dated Nov. 16, 2016, 15 pages.
U.S. Appl. No. 14/815,054: Final Rejection, dated Dec. 1, 2016, 9 pages.
U.S. Appl. No. 14/815,054: Response After Final Action, dated Jan. 24, 2017, 19 pages.
U.S. Appl. No. 14/815,054: Notice of Publication, dated Feb. 2, 2017, 1 page.
U.S. Appl. No. 14/815,054: After Final Consideration Program Decision, dated Feb. 6, 2017, 1 page.
U.S. Appl. No. 14/815,054: Advisory Action, dated Feb. 6, 2017, 2 pages.
U.S. Appl. No. 14/815,054: RCE and Amendments, dated Mar. 2, 2017, 18 pages.
U.S. Appl. No. 14/815,054: Notice of Allowance and Fees Due, dated Apr. 11, 2017, 5 pages.
U.S. Appl. No. 14/815,054: Issue Fee Payment, Jul. 11, 2017, 1 page.
U.S. Appl. No. 14/815,054: Issue Notification, dated Jul. 26, 2017, 1 page.
Communication pursuant to Rules 161(1) and 162 EPC, dated Mar. 7, 2018, International Patent Application No. 16751626.9, 3 pgs.
Response to Communication pursuant to Rules 161(1) and 162 EPC, filed Sep. 13, 2018, International Patent Application No. 16751626.9, 18 pgs.
Acknowledgement of Receipt for Response to Communication pursuant to Rules 161(1) and 162 EPC, filed Sep. 13, 2018, International Patent Application No. 16751626.9, 2 pgs.
Non-Final Office Action dated Oct. 1, 2019, Taiwan Patent Application No. 105124025, 15 pgs.
Response to Non-Final Office Action filed Dec. 27, 2019, Taiwan Patent Application No. 105124025, 22 pgs.
Notice of Allowance dated Jan. 17, 2020, Taiwan Patent Application No. 105124025, 4 pgs.
Celinska, et al, "Material and process optimization of correlated electron random access memories," Journal of Applied Physics 109, 091603, 2011, 10.1063/1.3581197, 8 Pages.
Notice of Reasons for Rejection, App. No. JP2018-504847, Drafted Aug. 19, 2020, 11 Pages.
Communication pursuant, to Article 94(3) EPC, App. No. 16751626.9, dated Jun. 24, 2020, 6 Pages.
Celinska, "Material and process optimization of correlated electron random access memories," Journal of Applied Physics 109, 091 603, 2011, 7 Pages.
Inoue, "Strong electron correlation effects in non-volatile electronic memory devices," Applied Physics Letters 88(3):033510-033510-3, Jan. 2006, 6 Pages.
Translation of Official Letter, App. No. TW105124025, Issued Oct. 1, 2019, 7 Pages.
Translation of Examination Report, App. No. IN201847006514, Filed Feb. 21, 2018, 5 Pages.
Communication pursuant to Article 94(3) EPC, App. No. EP16751626.9, dated Jun. 24, 2020, 6 Pages.
Response to Communication pursuant to Article 94(3) EPC, App. No. EP16751626.9, Filed Nov. 2, 2020, 11 Pages.
Examination report under sections 12 & 13 of the Patents Act, App. No. IN201847006514, dated Jun. 29, 2020, 6 Pages.
Response to Examination report under sections 12 & 13 of the Patents Act, App. No. IN201847006514, Filed Dec. 29, 2020, 16 Pages.
Notice of Reasons for Rejection, App. No. JP2018-504847, dated Aug. 24, 2020, 6 Pages.
Response Notice of Reasons for Rejection, App. No. JP2018-504847, Filed Nov. 24, 2020, 11 Pages.

* cited by examiner

CORRELATED ELECTRON SWITCH

This application is a continuation of U.S. patent application Ser. No. 14/815,054, titled CORRELATED ELECTRON SWITCH, filed Jul. 31, 2015, and is incorporated herein by reference in its entirety.

BACKGROUND

Field

Subject matter disclosed herein may relate to a correlated electron switch device.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory and/or logic devices, that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
FIG. 1b depicts an example symbol for a correlated electron switch.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure incorporate correlated electron material (CEM) to form a correlated electron switch (CES), such as, for example, in memory and/or logic devices. CES devices may also be utilized in other types of electronic circuits, such as, for example, filter circuits, as discussed more fully below. However, the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_C)1^{/3} a \approx 0.26$, where $n_C$ is a concentration of electrons and "a" is the Bohr radius. When a critical carrier concentration is achieved such that the Mott criteria is met, the Mott transition will occur and the state of the CES will change from a higher resistance/higher capacitance state to a lower resistance/lower capacitance state.

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

In a further aspect, switching from an insulative/higher impedance state to a conductive/lower impedance state may bring about a change in capacitance in addition to a change in resistance. That is, in an aspect, a CES may comprise the property of variable resistance together with the property of variable capacitance. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

Figure 1A:
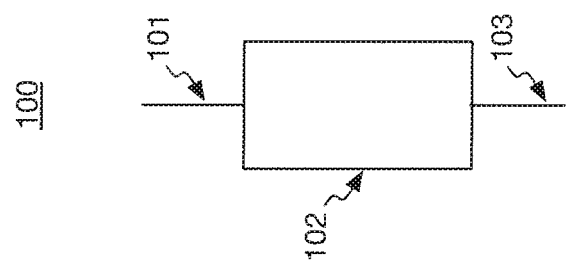
FIG. 1a shows block diagram of an example embodiment of a correlated electron switch device comprising a correlated electron material, in accordance with an embodiment.

FIG. 1a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as variable impeder 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as variable impeder device 100, may comprise CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a variable impeder device may comprise a bulk switch, in that substantially all of a CEM of a variable impeder device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a variable impeder device may be detected based, at least in part, on a signal detected on terminals of the variable impeder device in a read and/or sense operation. In another particular embodiment, as described below, a variable impeder device may be placed in a particular impedance state to represent or store a particular value, symbol, and/or parameter, and/or to achieve a particular capacitance value for the variable impeder device by application of one or more signals across terminals of the variable impeder device in a "write" and/or "program" operation, for example. Of course, claimed subject matter is not limited in scope to the particular example embodiments described herein.

FIG. 1b depicts an example symbol 110 that may be utilized, for example, in electrical circuit schematic diagrams to notate a CES and/or a variable impeder device. Example symbol 110 is meant to remind the viewer of the variable resistance and variable capacitance properties of a CES and/or variable impeder device, such as variable impeder device 100. Example symbol 110 is not meant to represent an actual circuit diagram, but is merely meant as an electrical circuit diagram symbol. Of course, claimed subject matter is not limited in scope in these respects.

Figure 2:
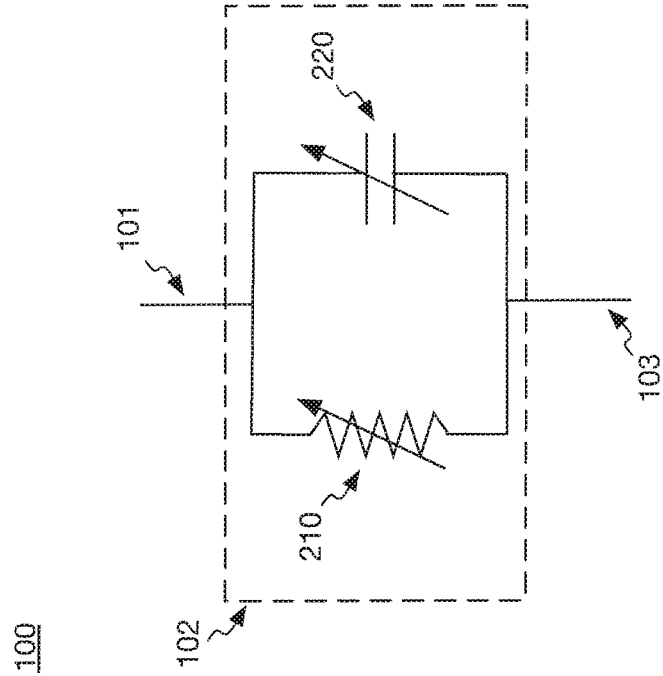
FIG. 2 is a schematic diagram of an equivalent circuit of a correlated electron switch, in accordance with an embodiment.

FIG. 2 depicts a schematic diagram of an equivalent circuit of an example variable impeder device, such as variable impeder device 100. As mentioned, a variable impeder device may comprise characteristics of both variable impedance and variable capacitance. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as variable impeder device 100, may comprise a substantially homogenous CEM, such as CEM 102, wherein the CEM comprises characteristics of variable capacitance and variable resistance.

Table 1 below depicts an example truth table for an example variable impeder device, such as variable impeder device 100.

TABLE 1

Correlated Electron Switch Truth Table

| Resistance | Capacitance |
|---|---|
| $R_{high}(V_{applied})$ | $C_{high}(V_{applied})$ |
| $R_{low}(V_{applied})$ | $C_{low}(V_{applied})$~0 |

In an embodiment, example truth table 120 shows that a resistance of a variable impeder device, such as variable impeder device 100, may transition between a lower resistance state and a higher resistance state that is a function, at least in part, of a voltage applied across the CEM. In an embodiment, a resistance of a lower resistance state may be 10-100,000 times lower than a resistance of a higher impedance state, although claimed subject matter is not limited in scope in this respect. Similarly, example truth table 120 shows that a capacitance of a variable impeder device, such as variable impeder device 100, may transition between a lower capacitance state, which for an example embodiment may comprise approximately zero, or very little, capacitance, and a higher capacitance state that is a function, at least in part, of a voltage applied across the CEM. It should be noted that a variable impeder is not a resistor, but rather comprises a device having properties of both variable capacitance and variable resistance. In an embodiment, resistance and/or capacitance values depend, at least in part, on an applied voltage.

Figure 3:
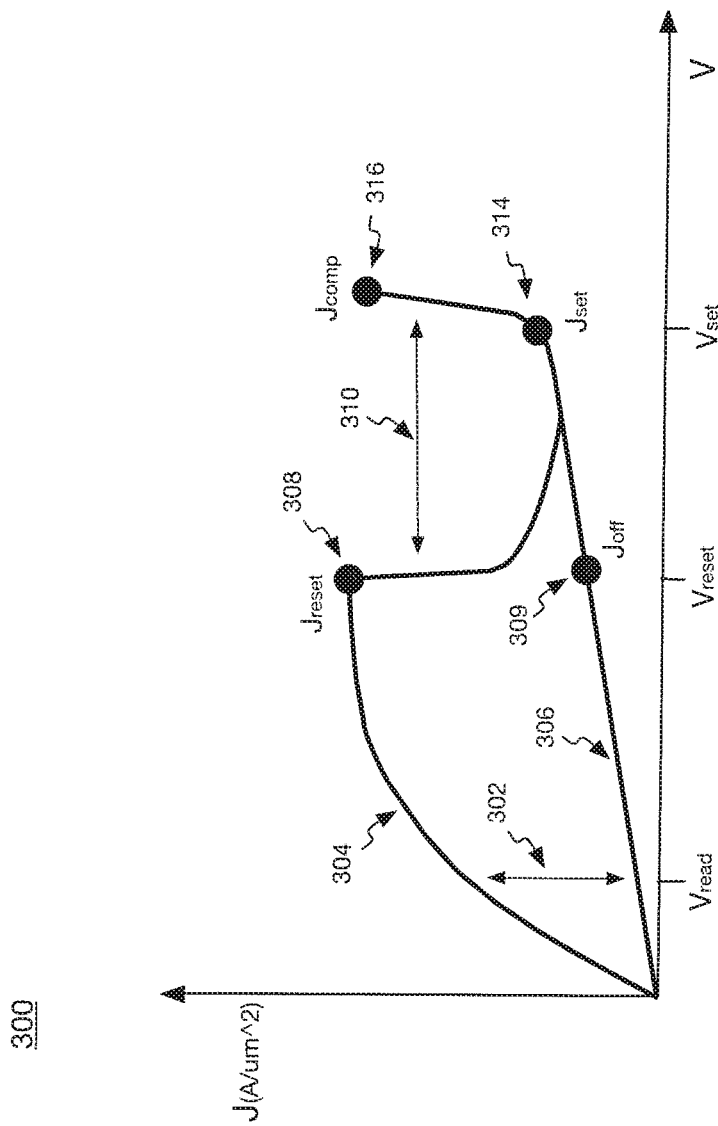
FIG. 3 shows a plot of current density versus voltage for a correlated electron switch, according to an embodiment.

FIG. 3 shows a plot of current density versus voltage across electrically conductive terminals, such as electrically conductive terminals 101 and 103, for a variable impeder device, such as example variable impeder device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the variable impeder device in an insulative/higher impedance state, and application of a voltage $V_{set}$ and a current density $J_{set}$ may place the variable impeder device in a conductive/lower impedance state. That is, a "set" condition may place a variable impeder device, such as variable impeder device 100, into a conductive/lower impedance state, and a "reset" condition may place a variable impeder device, such as variable impeder device 100, into an insulative/higher impedance state, in an embodiment. Following placement of the variable impeder device in a lower impedance state or a higher impedance state, the particular state of the variable impeder device may be detected at least in part by application of a voltage $V_{read}$ (e.g., in a read operation) and detection of a current or current density at terminals, such as electrically conductive terminals 101 and 103, of a variable impeder device, such as variable impeder device 100.

In an embodiment, a CEM of a variable impeder device may include, for example, any TMO, such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$ Br}Br$_2$ where M may comprise Pt, Pd, or Ni, and chxn comprises 1R,2R-cyclohexanediamine, and other such metal complexes may be used without deviating from the scope of claimed subject matter.

In one aspect, the variable impeder device of FIG. 1 may comprise materials that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

According to an embodiment, if sufficient bias is applied (e.g., exceeding a band-splitting potential) and the aforementioned Mott condition is met (injected electron holes=the electrons in the switching region), the variable impeder device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the variable impeder device is still in the insulative/higher impedance state, current may generated by transportation of holes. If enough bias is applied across terminals of the variable impeder device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the variable impeder device in a conductive/lower impedance state.

According to an embodiment, current in a CEM of a variable impeder device may be controlled by an exterally applied "compliance" condition determined based, at least in part, on the external current limited during a write operation to achieve a set condition to place the variable impeder device in a conductive/lower impedance state. This exter- nally applied compliance current also sets the subsequent reset condition current density requirement. As shown in the particular implementation of FIG. 3, a current density J$_{comp}$ applied during a write operation at point 316 to place the variable impeder device in a conductive/lower impedance state may determine a compliance condition for placing the variable impeder device in an insulative/higher impedance state in a subsequent write operation. As shown, the CEM of the variable impeder device may be subsequently placed in an insulative/higher impedance state by application of a current density J$_{reset}$≥J$_{comp}$ at a voltage V$_{reset}$ at point 308, wherein J$_{comp}$ may be externally applied, in an embodiment.

A compliance current, such as an externally applied compliance current, therefore may set a number of electrons in a CEM of a variable impeder device which are to be "captured" by holes for the Mott transition. In other words, a current applied in a write operation to place a variable impeder device in a conductive/lower impedance state may determine a number of holes to be injected to the CEM of the variable impeder device for subsequently transitioning the variable impeder device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a variable impeder device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \quad (1)$$
$$n = \left(\frac{C}{\lambda_{TF}}\right)^3$$

where:
$\lambda_{TF}$ is a Thomas Fermi screening length; and
C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as variable impeder device 100. Here, injection of holes may meet a Mott transition criterion for the conductive to insulator transition at current I$_{MI}$ as a critical voltage V$_{MI}$ is applied across terminals, such as terminal 101 and 103, of a variable impeder device, such as variable impeder device 100. This may be modeled according to expression (2) as follows:

$$I_{MI}(V_{MI}) = \frac{dQ(V_{MI})}{dt} \approx \frac{Q(V_{MI})}{t} \quad (2)$$
$$Q(V_{MI}) = qn(V_{MI})$$

Where Q(V$_{MI}$) is the charge injected (hole or electron) and is a function of the applied voltage. As used herein, the notation "MI" signifies a metal-to-insulator transition, and the notation "IM" signifies an insulator-metal transition. That is, "V$_{MI}$" refers to a critical voltage and "I$_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Wherein $A_{CEM}$ is a cross-sectional area of a CEM, such as CEM 102, of a variable impeder device, such as variable impeder device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the variable impeder device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as variable impeder device 100, may be placed in a conductive/lower impedance state (e.g., by transitioning from an insulative/higher impedance state) by injection of a sufficient number of electrons to satisfy a Mott transition criteria.

In transitioning a CEM of a variable impeder device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the variable impeder device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where:
$a_B$ is a Bohr radius.

According to an embodiment, a "read window" 302 for detecting a memory state of a variable impeder device in a read operation may be set out as a difference between a portion 306 the plot of FIG. 3 while the CEM of the variable impeder device is in an insulative/higher impedance state and a portion 304 of the plot FIG. 3 while the CEM of the variable impeder device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as variable impeder device 100. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of variable impeder device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the variable impeder device.

In an embodiment, a process for reading a value represented as an impedance state of a variable impeder device, such as variable impeder device 100, may comprise a voltage being applied to a CEM of a variable impeder device. At least one of a current and/or current density within a CEM of a variable impeder device may be measured, and an impedance state of a CEM of a variable impeder device may be determined, at least in part, on the measured current and/or current density, in an embodiment.

Additionally, in an embodiment, an impedance of an impedance state may depend at least in part on a combination of a capacitance and a resistance of a CEM of a variable impeder device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the variable impeder device. In an embodiment, the physical property of the CEM of the variable impeder device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a variable impeder device such that the CEM enters a first impedance state. A plurality of holes may be provided to the CEM such that the CEM enters a second impedance state. Also, in an embodiment, the plurality of electrons may cause a voltage across the CEM to be greater than a set voltage threshold, and the plurality of holes may cause the voltage across the CEM to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a variable impeder device may be exceeded. Additionally, a reset voltage across a CEM and a reset current density through a CEM of a variable impeder device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a variable impeder device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

Figure 4:
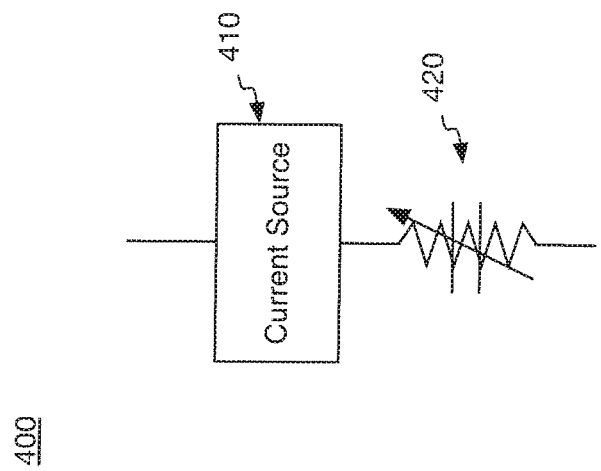
FIG. 4 depicts a schematic diagram of an example compound device, in accordance with an embodiment.

FIG. 4 depicts a schematic diagram of an embodiment 400 of an example compound device. As utilized herein, the term "compound device" refers to a CES, such as CES 420, coupled to a current and/or voltage source, such as current source 410. In an embodiment, compound device behavior may be defined, at least in part, by how a CES, such as CES 420, behaves when coupled to an external current and/or voltage source, such as current source 410. Example current sources may include, but are not limited to, a diode and/or a transistor, in an embodiment. As described above, a CES, such as CES 420, may require both critical voltage and critical current conditions to achieve a set condition and/or to achieve a reset condition. In an embodiment, set and reset conditions comprise unique physical actions. For example, set and/or reset conditions individually require particular carrier densities (i.e., to meet the Mott criteria) and an applied bias to inject holes and/or electrons into the CEM of a CES device. Therefore, a CES, such as CES 420, may exhibit different, distinct characteristics when coupled with different current and/or voltage sources, such as current source 410, in an embodiment. Thus, coupling a CES, such as CES 420, to different current and/or voltage sources, such as current source 410, may yield different compound devices exhibiting characteristics that depend, at least in part, on the particular current and/or voltage source. As a CES requires both a critical voltage and current (as apposed to a one or the other) to transition from one impedance state to another, compound device behavior can varying widely, depending at least in part on the characteristics of the current/voltage source. That compound device behavior may depend, at least in part, on the particular current and/or voltage source coupled to a CES may be understood through examination of the following Kirchhoff Current Law equations, represented by expressions (6) below:

$$J_{CEM}(V_{CEM}) = J_{critical}(V_{critical}) = J_{reset}(V_{reset}) \text{ or } J_{set}(V_{set}) \quad (6)$$

$$J_{CEM}(V_{CEM}) = \sigma E_{CEM}(V_{CEM}) = \frac{I_{source}(V_{source})}{A_{CEM}}$$

-continued $$E_{CEM}(V_{CEM}) \sim \frac{(V_{CEM})}{d_{CEM}}$$

$$J_{CEM}(V_{CEM}) = \sigma \frac{V_{CEM}(V_{CEM})}{d_{CEM}} = \frac{I_{source}(V_{source})}{A_{CEM}}$$

$$I_{source}(V_{source}) = J_{CEM}(V_{CEM})A_{CEM} = \frac{A_{CEM}}{d_{CEM}}\sigma V_{CEM}$$

wherein σ represents CEM conductivity, $A_{CEM}$ represents an area of a CEM of a CES device, and $d_{CEM}$ represents a depth or thickness of the CEM of the CES device.

From expressions (6) above, it may be seen that criteria for switching from a conductive/lower impedance state to an insulative/higher impedance state or from an insulative/higher impedance state to a conductive/lower impedance state for a CES may be determined at least in part by CEM design. In an embodiment, CEM material composition and/or dimensions may affect switching criteria. For example, an increase in CEM area may result in an increase in critical current ($I_{critical}$) and/or critical voltage ($V_{critical}$), in an embodiment. Similarly, current through a CES, such as CES 420, may depend at least in part on the particular characteristics of the current and/or voltage supply, such as current source 410, due at least in part to the duel dependency of critical voltage and critical current for switching. Also, in an embodiment, a Mott transition inside a CEM of a CES, such as CES 420, may be controlled and/or determined via one or more characteristics of a particular current and/or voltage source, such as current source 410.

Figure 5:
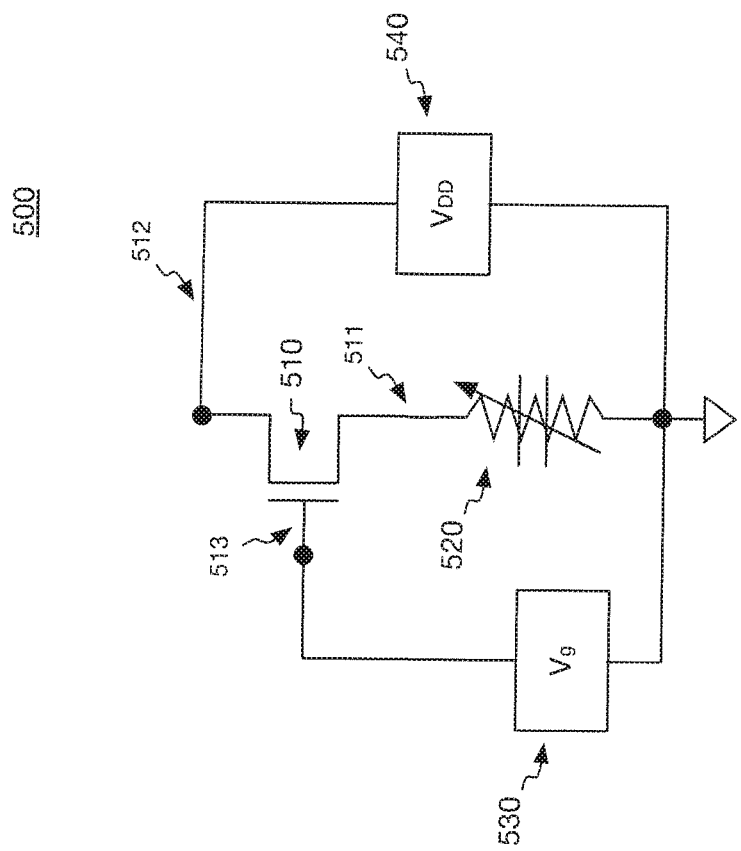
FIG. 5 depicts a schematic diagram of an example compound device comprising a transistor, in accordance with an embodiment.

FIG. 5 depicts a schematic diagram of an embodiment 500 of an example compound device comprising a transistor, such as transistor 510, as a current source coupled to a CES, such as CES 520. In an embodiment, a voltage source, such as voltage source ($V_{DD}$) 540, may be applied across a transistor, such as transistor 510, and a CES device, such as CES 520. An additional voltage source, such as voltage source (Vg) 530, may be applied to a transistor, such as transistor 510. For example, Vg 530 may be applied to a gate of an NMOS transistor, such as transistor 510, in an embodiment. The Kirchhoff Current Law equations represented by expressions (7) below may be utilized to consider one or more characteristics of example compound device 500 comprising example transistor 510 coupled to example CES 520.

$$I_{ds}(V_{gs}, V_{ds}, t) = \frac{A_{CEM}}{d_{CEM}}\sigma V_{CEM} \quad (7)$$

$$V_{CEM} = V_{DD} - V_{ds} = V_{DD} - I_{ds}R_{ds}$$

$$\sigma \sim \sigma(V_{gs})$$

$$I_{ds}(V_{gs}, V_{ds}, t) = \frac{A_{CEM}}{d_{CEM}}\sigma(V_{gs})(V_{DD} - V_{ds})$$

$$I_{ds}(V_{gs}, V_{ds}, t) = \frac{A_{CEM}}{d_{CEM}}\sigma(V_{gs})(V_{DD} - I_{ds}R_{ds})$$

$$I_{ds}(V_{gs}, V_{ds}, t) = \frac{\frac{A_{CEM}}{d_{CEM}}\sigma(V_{gs})V_{DD}}{1 + \frac{A_{CEM}}{d_{CEM}}\sigma(V_{gs})R_{ds}}$$

wherein $I_{ds}$ represents a current through a transistor, such as transistor 510, wherein $V_{ds}$ represents a voltage across a transistor, such as across source and drain terminals 511 and 512 of transistor 510, and wherein $V_{gs}$ represents a voltage applied to a transistor, such as across gate and source terminals 513 and 511 of transistor 510, in an embodiment.

Additionally, $R_{ds}$ represents a resistance of a transistor, such as between drain and source terminals 512 and 511 of transistor 510.

As may be seen in expressions (7) above, a current through a CEM of a CES device, such as CES 520, may depend at least in part on a voltage, such as $V_{DD}$ 540, applied across both a transistor, such as transistor 510, and a CES device, such as CES 520, and may also depend, at least in part, on a voltage, such as $V_g$ 530, applied to a terminal of a transistor, such as gate terminal 513 of transistor 510. Therefore, a Mott transition inside a CEM of a CES device, such as CES 520, may be controlled and/or determined at least in part via voltages and/or characteristics of a transistor, such as transistor 510, in an embodiment. For example, a voltage drop across a transistor, such as $V_{ds}$ of transistor 510, may be reduced and/or increased depending on a voltage, such as $V_g$ 530, applied to a terminal, such as gate terminal 513, of a transistor, such a transistor 510. Similarly, a voltage, such as $V_g$ 530, applied to a terminal, such as gate terminal 513, of a transistor, such a transistor 510, may control an injection of holes and/or electrons in a CEM of a CES device, such as CES 520. Additionally, in an embodiment, a critical voltage for a CEM of a CES device, such as CES 520, may be set at least in part by a voltage across a transistor, such as $V_{ds}$ across source and drain terminals 511 and 512 of transistor 510, and/or by a voltage, such as $V_{DD}$ 540, applied across both a transistor, such as transistor 510, and a CES device, such as CES 520. For example, a critical voltage for CES 520 may be determined, at least in part, by $V_{ds}$ of transistor 510 and/or by $V_{DD}$ 540. Similarly, for example, a critical current may be determined, at least in part, by $V_g$ 530 applied to gate terminal 513 of transistor 510, in an embodiment.

Expression (8) provided below represents a special case of expression (7) provided above when σ is relatively large, such as when a CEM is placed in a conductive/lower impedance state.

$$I_{ds}(V_{gs}, V_{ds}, t) \sim \frac{V_{DD}}{R_{ds}(V_{gs}, V_{ds}, t)} \quad (8)$$

For situations in which σ is relatively large, such as when a CEM of a CES device is placed in a conductive/lower impedance state, current may pass through a CES device, such as CES 520, with little voltage drop. Therefore, as can be seen from expression (8), current flowing through a CES device, such as CES 520, may depend, at least in part, on a voltage, such as $V_{DD}$ 540, applied to a transistor, such as transistor 510, and on a resistance of the transistor, such as $R_{ds}$ of transistor 510, in an embodiment. This situation where the resistance of a transistor, such as transistor 510, largely determines the amount of current flowing through a CES device, such as CES 520, may occur when the resistance of the transistor is significantly greater than the resistance of the CES device while the CES device is in a conductive/lower impedance state, for example.

Expression (9) provided below represents a special case of expression (7) above when σ is relatively small, such as when a CEM is placed in an insulative/higher impedance state.

$$I_{ds}(V_{gs}, V_{ds}, t) \sim \frac{A_{CEM}}{d_{CEM}} \sigma(V_{gs}) V_{ds} \quad (9)$$

For situations in which σ is relatively small, such as when a CEM of a CES device is placed in an insulative/higher impedance state, current through a transistor, such as transistor 510, may be substantially controlled and/or determined by a resistance of a CEM of a CES device, such as CES 520. In such a situation, $V_{DD}$ 540 may approximate $V_{ds}$ due at least in part to a larger voltage drop across CES 520, in an embodiment.

Figure 6:
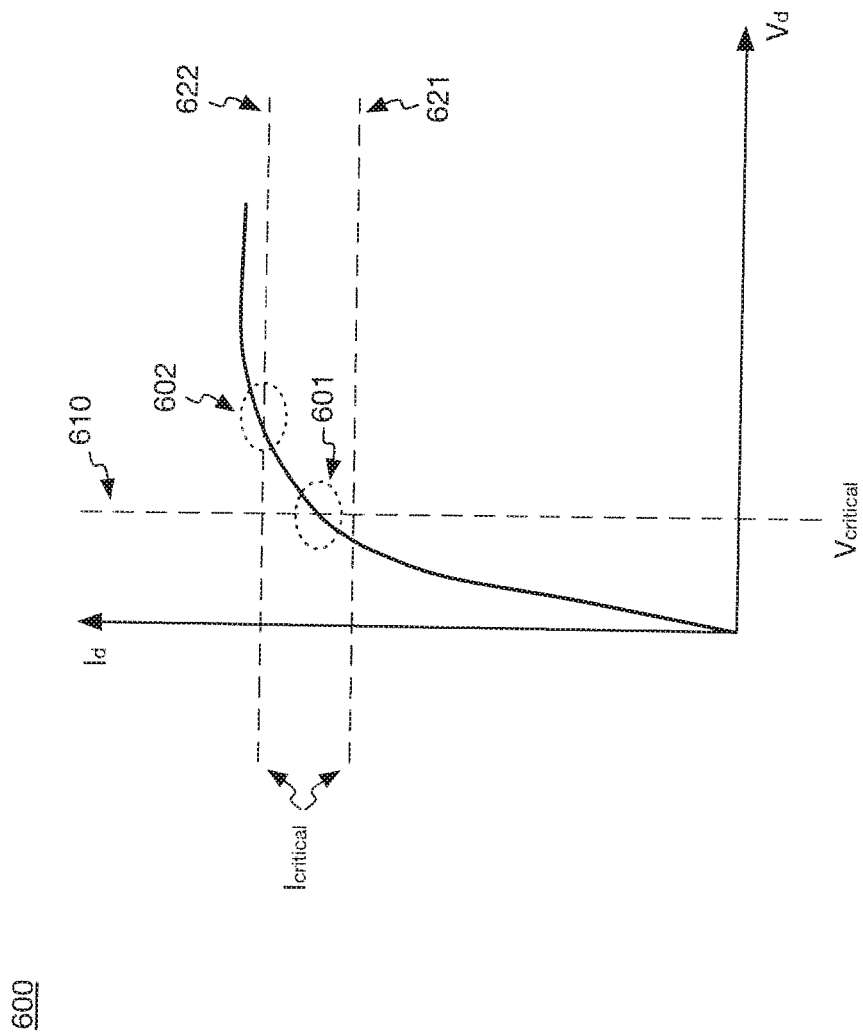
FIG. 6 shows an example plot depicting an example current vs. voltage curve for an example correlated electron switch device, in accordance with an embodiment.

Continuing with an example embodiment of a compound device, such as compound device 500, comprising a transistor, such as transistor 510, coupled to a CES, such as CES 520, FIG. 6 shows an example plot 600 depicting an example current vs. voltage curve for a CES device, such as CES device 520. For example plot 600, a critical current 621 corresponding to a particular area size of a CEM of a CES device, such as CES 520, is shown. A second critical current 622 corresponding to a second particular area size of a CEM of a CES device, such as CES 520, is also depicted. For example plot 600, a CEM area corresponding to critical current 622 is greater than a CEM area corresponding to critical current 621. Thus, example plot 600 shows that an increase in CEM area may result in an increase in critical current, thereby affecting switching behavior of a CES device, such as CES 520, and by extension the switching behavior of a compound device, such as compound device 500.

As previously discussed, for a Mott transition to occur, both a critical current and a critical voltage need to be achieved in a CEM of a CES device, such as CES 520. For the example depicted in plot 600, for the smaller CEM area corresponding to critical current 621, a critical current and critical voltage are achieved, and a Mott transition occurs, at point 601. For the larger CEM area corresponding to critical current 622, a critical current and critical voltage are achieved at point 602. Of course, claimed subject matter is not limited in scope to the specific examples described herein.

Figure 7:
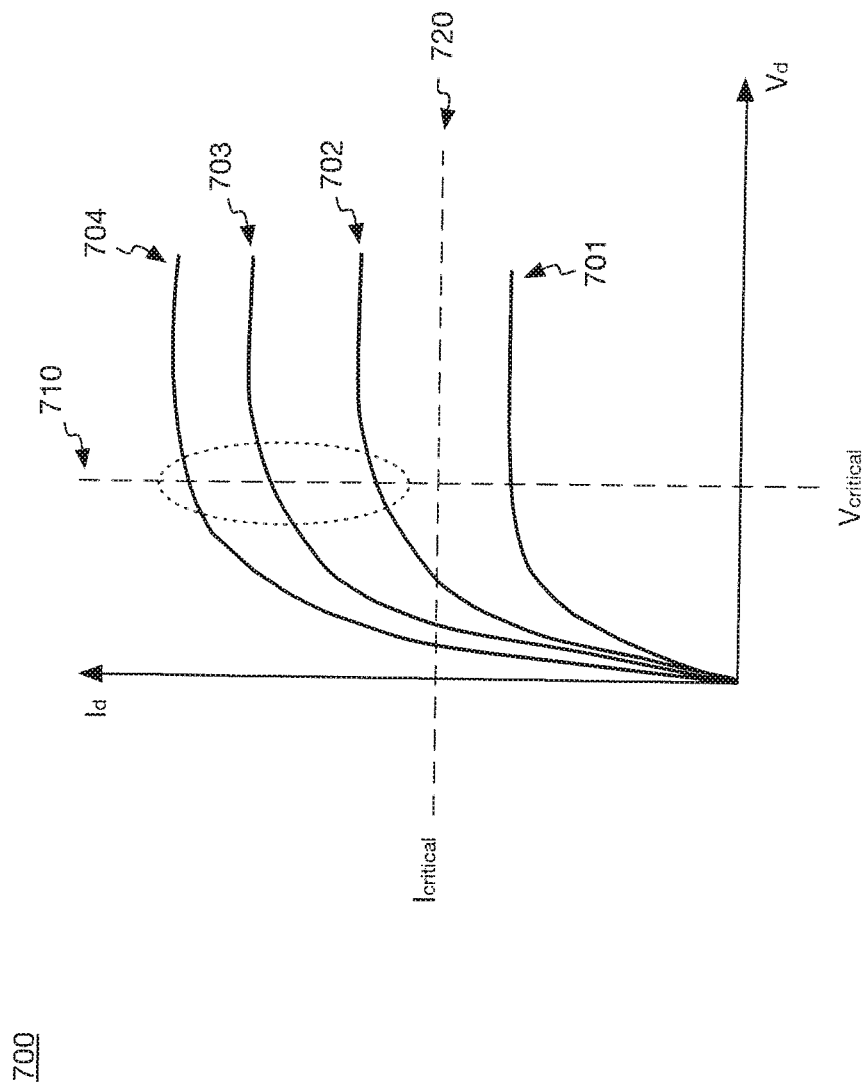
FIG. 7 shows an example plot depicting example current vs. voltage curves for an example correlated electron switch device, in accordance with an embodiment.

Continuing with an example embodiment of a compound device, such as compound device 500, comprising a transistor, such as transistor 510, coupled to a CES, such as CES 520, FIG. 7 shows an example plot 700 depicting example current vs. voltage curves, such as curves 701-704, for a CES device, such as CES device 520. The various example curves, such as curves 701-704, may represent current vs. voltage characteristics corresponding to different voltages, such as different values of $V_g$ 530, that may be applied to a terminal, such as gate terminal 513, of a transistor, such a transistor 510, of a compound device, such as compound device 500, in an embodiment. For the example depicted in plot 700, curve 704 corresponds to a $V_g$ 530 that may exceed a $V_g$ 530 for curve 703. Similarly, curve 703 corresponds to a $V_g$ 530 that may exceed a $V_g$ 530 for curve 702, and curve 702 corresponds to a $V_g$ 530 that may exceed a $V_g$ 530 for curve 701. A critical current value 720 is depicted, along with a critical voltage value 710. As described previously, to trigger a set and/or reset condition, that is, to trigger a Mott transition, both the critical current and the critical voltage must be achieved within a CEM of a CES device, such as CES 520, for example.

For the example depicted in plot 700 of FIG. 7, a $V_g$ 530 corresponding to example curve 701 would be insufficient to trigger a set and/or reset condition because critical current value 720 is never reached. However, a $V_g$ 530 corresponding to example curves 702, 703, and/or 704 would be sufficient to cause a set and/or reset condition to occur. Further, as explained in more detail below, different values for $V_g$ 530, for example, may result in different values for $R_{sd}$ and $I_{ds}$. Additionally, there may also be relatively small changes in critical voltage for set and/or reset conditions if different compliance currents are utilized.

Figure 8:
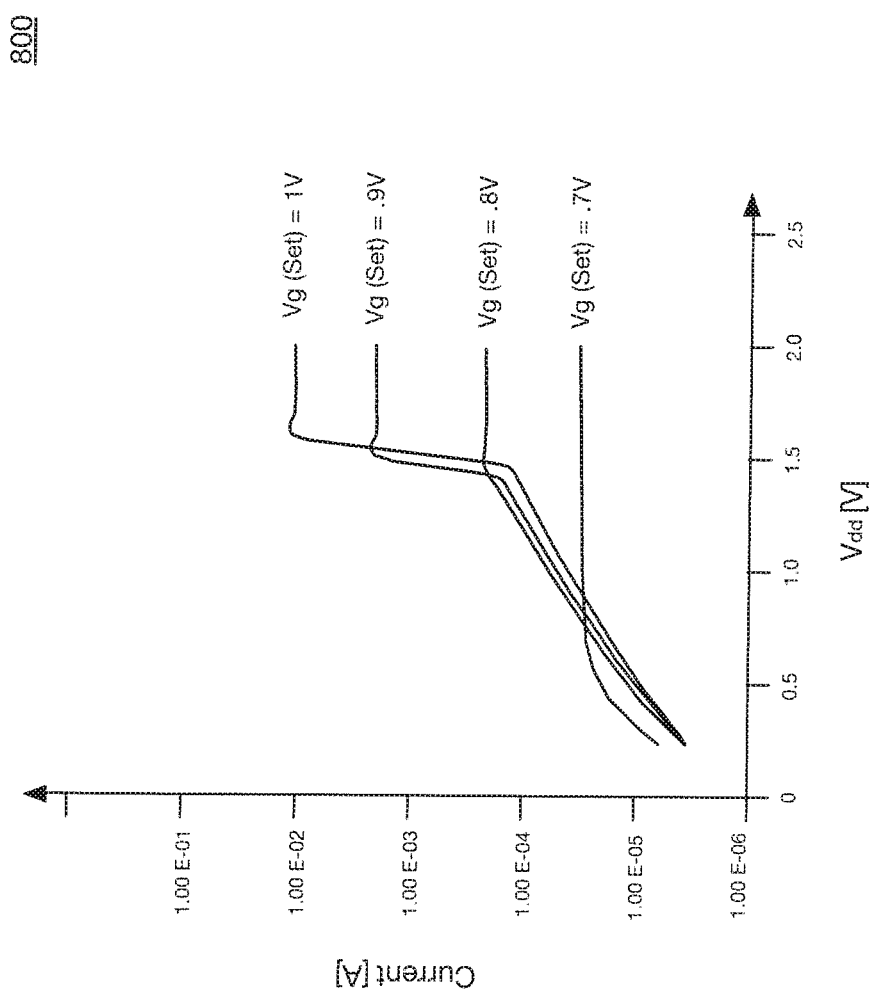
FIG. 8 shows an example plot depicting example current vs. voltage curves representative of data collected for a set condition for an example correlated electron switch device, in accordance with an embodiment.

FIG. 8 is an example plot 800 depicting several example current vs. voltage curves representative of data collected for different example values of $V_g$ 530 for a set condition, or, in other words, a transition from a higher impedance state to a lower impedance state for an example CES, such as CES 520 of a compound device, such as example compound device 500. As mentioned previously, a compliance current may be externally applied to a CES, such as CES 520. As depicted in example plot 800 of FIG. 8, $V_g$ such as $V_g$ 530, may be utilized to dynamically change the compliance. Also, for the examples depicted in FIG. 8, a set condition for $V_g$=0.7V may not have been achieved because the critical criteria for a Mott transition was not reached.

Figure 9:
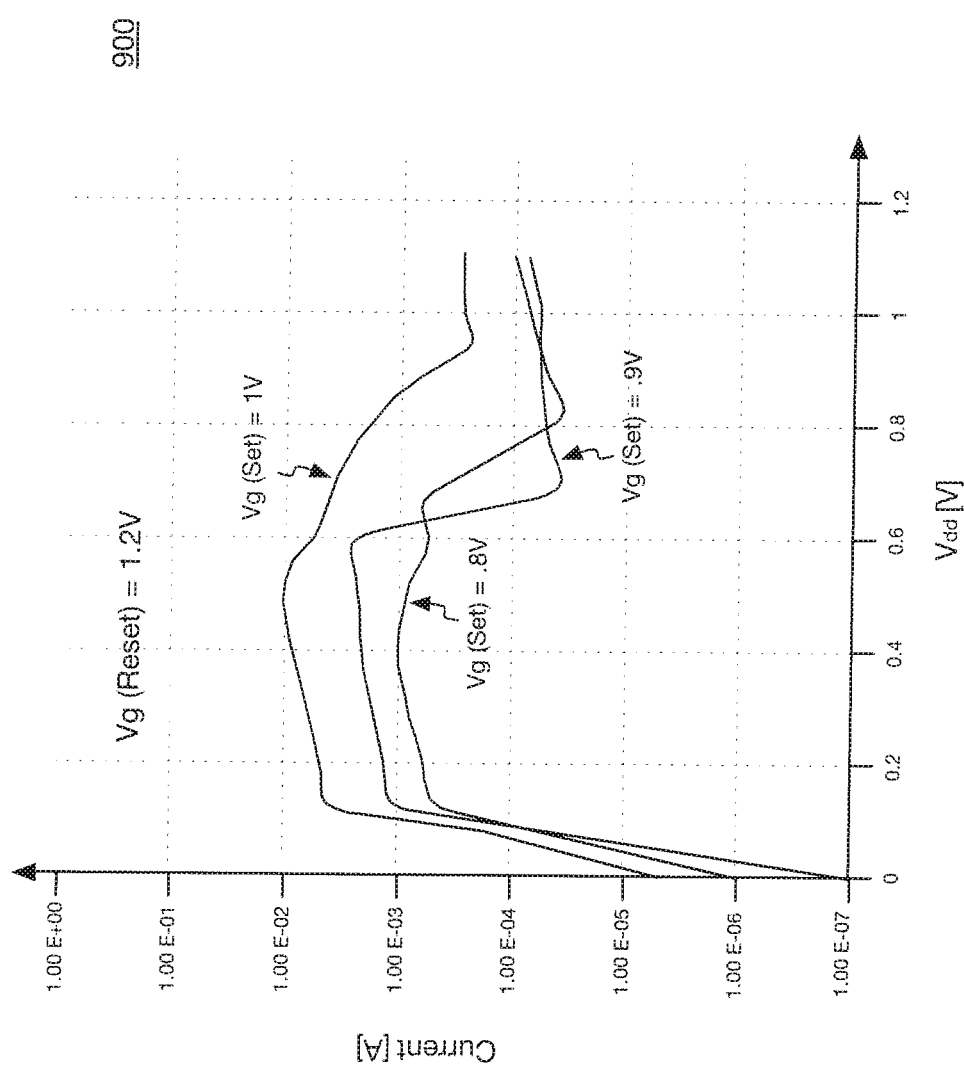
FIG. 9 shows an example plot depicting example current vs. voltage curves representative of data collected for a reset condition for an example correlated electron switch device, in accordance with an embodiment.

FIG. 9 is an example plot 900 depicting several example current vs. voltage curves representative of data collected for different values of $V_g$ 530 for a reset condition, or, in other words, a transition from a conductive/lower impedance state to an insulative/higher impedance state for an example CES, such as CES 520 of a compound device, such as example compound device 500. As also mentioned previously, and as depicted in example plot 800, a compliance current may set the number of electrons in a CEM of a CES device, such as CES 520, which may determine the amount of holes to be injected for a reset condition (i.e., a Mott transition from a conductive/lower impedance state to an insulative/higher impedance state). As may be seen in example plot 900 depicted in FIG. 9, different values for $V_g$ applied during a set condition may yield different current vs. voltage curve characteristics for a reset condition, in an embodiment. Also note that there is no reset depicted for V=0.7V because the device result depicted in 800 did not set at 0.7V as it did not reach the critical criteria for the Mott transition, as mentioned above.

As discussed previously in connection with FIG. 3, a current and/or current density applied during a write operation to place a CES, such as CES 520, in a conductive/lower impedance state (i.e., a set condition) may determine a compliance condition for placing the CES, such as CES 520, in an insulative/higher impedance state (i.e., a reset condition) in a subsequent write operation. As depicted in FIG. 3, a CEM of a CES device, such as CES 520, may be subsequently placed in an insulative/higher impedance state (i.e., a reset condition) by application of a current density $J_{reset} \geq J_{comp}$ at a voltage $V_{reset}$, wherein $J_{comp}$ may be externally applied, in an embodiment.

Therefore, a compliance current, such as may be externally applied via $V_{gs}$ 530, may determine a number of electrons in a CEM of a CES device, such as CES 520, which are to be "captured" by electron holes for the Mott transition for a reset condition. In other words, a current applied in a write operation to place a CES device in a conductive/lower impedance state may determine a number of holes to be injected to the CEM of the CES device for subsequently transitioning the CEM of the CES to an insulative/higher impedance state. Also, for an embodiment, after reset, the system may lose memory of any previous compliance, and the compliance condition may need to be reapplied during a subsequent set condition. This behavior is depicted in FIGS. 8 and 9, described above.

Figure 10:
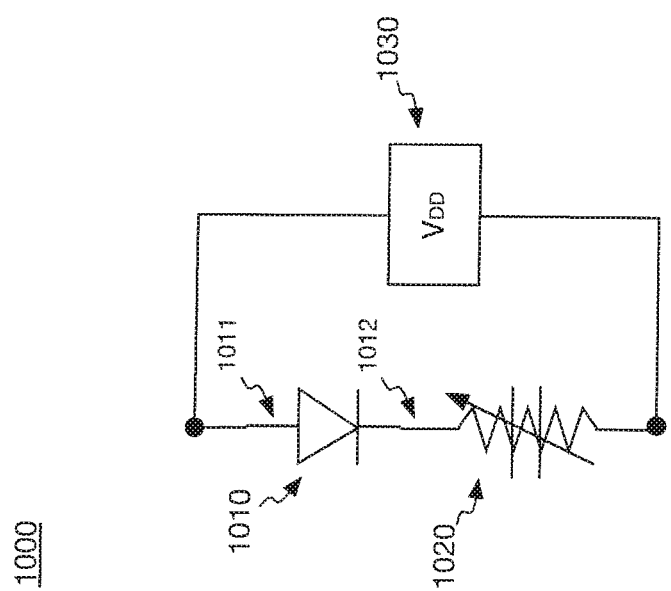
FIG. 10 depicts a schematic diagram of an example compound device comprising a transistor, in accordance with an embodiment.

FIG. 10 is a schematic diagram depicting an embodiment 1000 of an example compound device comprising a CES device, such as CES 1020, coupled to a diode, such as diode 1010. In an embodiment, diode 1010 may comprise a current and/or voltage source, along with a voltage, such as $V_{DD}$ 1030, applied across both diode 1010 and CES 1020. Characteristics of behavior for a compound device, such as compound device 1000, comprising a diode, such as diode 1010, may be described by expression (10), below.

$$I_{diode}(V_{CE}, t) = I_O \left( e^{\frac{V_{CE}}{nV_t}} - 1 \right) \qquad (10)$$

$$I_{diode}(V_{CE}, t) = \frac{A_{CEM}}{d_{CEM}} \sigma V_{CEM}$$

$$V_{CEM} = V_{DD} - V_{ce} - V_{DD} - I_{diode} R_{diode}$$

wherein $V_{ce}$ represents a voltage across terminals, such as terminals 1011 and 1012, of a diode, such as diode 1010.

Figure 11:
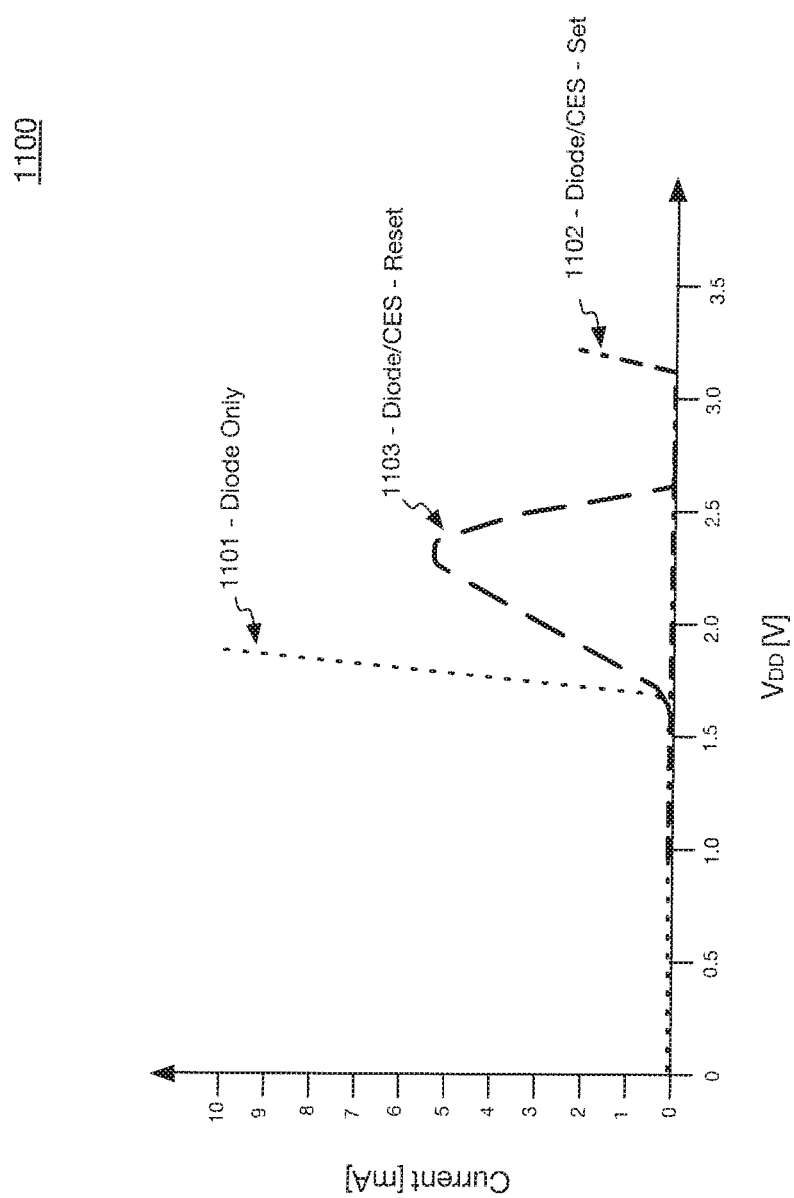
FIG. 11 shows an example plot depicting example current vs. voltage curves representative of data collected for an example compound device including a diode, in accordance with an embodiment.

FIG. 11 depicts an example plot 1100 including an example current vs. voltage curve 1102 representative of data collected for an example set condition and an example curve 1103 representative of data collected for an example reset condition. Example curve 1101 depicts example current vs. voltage data for a diode-only, such as may be observed across terminals 1011 and 1012 of diode 1010 of example compound device 1000, for example. As depicted in example plot 1100, utilization of a diode, such as diode 1010, as a current and/or voltage source for a compound device, such as compound device 1000, results in a shifting of both Diode/CES—Reset 1103 ($V_{reset}$) and Diode/CES—Set ($V_{set}$) due to a voltage drop across the diode. For example, a diode, such as diode 1010, needs to turn on before a critical voltage can be developed across a CES device, such as CES 1020, and before a critical current can be developed so that switching can occur.

As mentioned previously, for a compound device, such as compound device 1000, a CES device, such as CES 1020, may adopt characteristic behavior of a current and/or voltage source, such as diode 1010, in an embodiment. In an embodiment, current through a CES device, such as CES 1020, may be dependent on a voltage, such as $V_{ce}$, across terminals, such as terminals 1011 and 1012, of a diode, such as diode 1010. In an embodiment, a voltage, such as $V_{ce}$, across terminals, such as terminals 1011 and 1012, of a diode, such as diode 1010, may set a critical voltage and critical current for a compound device, such as compound device 1000. Expression (11) below represents a special case of expression (10) when σ is relatively large, such as when a CEM is placed in a conductive/lower impedance state.

$$I_{diode}(V_{ce}) \sim \frac{V_{DD}}{R_{diode}(V_{ce})} \qquad (11)$$

Expression (12) below represents a special case of expression (10) when σ is relatively small, such as when a CEM is placed in an insulative/higher impedance state.

$$I_{diode}(V_{ce}) \sim \frac{A_{CEM}}{d_{CEM}} \sigma V_{DD} \qquad (12)$$

For situations in which σ is relatively large, such as when a CEM of a CES device is placed in a conductive/lower impedance state, a current through a CES device, such as CES 1020, may be dominated by the diode, such as diode 1010. For situations in which σ is relatively small, such as when a CEM of a CES device, such as CES 1020, is placed in an insulative/higher impedance state, the current through the CES device, such as CES 1020, may be determined mainly by the resistance of a diode, such as diode 1010. As compared with example compound device 500 comprising a transistor 510, the possible behavioral options for example compound device 1000, comprising diode 1010, are more limited. This is due mainly to the fact that $V_{ce}$ is the only voltage that can be varied for a compound device implementing a diode as a current/voltage source, in an embodiment.

As mentioned above, a CES device, also referred to as a variable impeder device, such as variable impeder device 100, may be implemented in a wide range of electronic device types. For example, a variable impeder device, such as variable impeder device 100, may be utilized in logic circuits, memory circuits, filter circuits, etc. Generally speaking, a variable impeder device, such as variable impeder device 100, may be utilized in any circuit or device, presently existing or to exist in the future, that may benefit from the variable impeder device's variable resistance and/or variable capacitance characteristics.

For example, in an embodiment, a CES device, such as variable impeder device 100, may be implemented in a memory cell, for example. In one or more embodiments, a CES memory may comprise: a variable impeder memory cell including a CES; a write circuit for placing the variable impeder memory cell in a first impedance state or a second impedance state depending on signals provided to the memory device; and a read circuit for sensing an impedance state of the memory cell and providing an electrical signal corresponding to the sensed state of the memory cell. In one aspect, an impedance of a CES in the second memory cell state may be significantly greater than the impedance in the first memory cell state.

Figure 12:
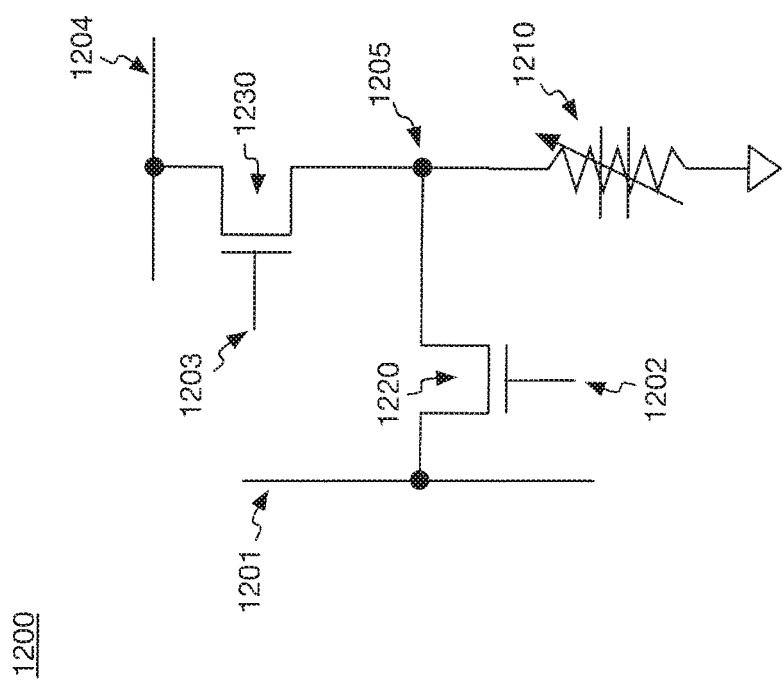
FIG. 12 is a schematic diagram of an example memory cell including a correlated electron switch device, in accordance with an embodiment.

FIG. 12 is a schematic diagram of an example architecture for a CES memory cell 1200 according with an embodiment. In an embodiment, a CES memory cell may comprise one or more memory elements (e.g., non-volatile memory elements) comprising a CES device, such as CES 1210. In this context, a "memory cell" as referred to herein comprises a circuit or portion of a circuit capable of representing a value, symbol or parameter as a state. For example, a memory cell may comprise one or more memory devices that capable of representing a value, symbol or parameter as an impedance state of the memory device. For example, a memory element, such as CES 1210, may be placed in a particular memory state (e.g., a lower impedance state or higher impedance state) by independently controlling voltage and current applied across terminals of the memory element in a "write operation." In an embodiment, such a write operation may be executed by application of a signal which is controlled to provide a critical current and voltage across terminals of CES 1210 to place CES 1210 in a particular impedance state. In another aspect, an impedance state of a memory element, such as CES 1210, may be detected or sensed in a "read operation" by applying a read enable voltage signal 1203 to close switch transistor 1230, and applying a wordline voltage signal 1202 to close transistor 1220 to connect a voltage at node 1205 to a bitline 1201. In an embodiment, a sense circuit (not shown) may detect an impedance state of CES 1210 based on a magnitude of current from bitline 1201 through transistor 1220 in a read operation. An output signal may have a voltage that is indicative of a current impedance state memory cell 1200 (e.g., as a "1," "0" or other symbol), in an embodiment. Of course, claimed subject matter is not limited in scope in these respects.

In one or more embodiments wherein a CES device is utilized, at least in part, as a memory cell and/or circuitry associated with a memory cell, advantages may be realized as compared to memory circuits incorporating conventional and/or prior memory technologies. For example, as a result of improved device reliability and/or improved endurance, needs for wear-leveling and/or error correcting circuitry may be reduced, and costs may also be reduced. Additionally, because a wide range of metal and/or conductive materials that may be used to form contacts in a CES device, ease of manufacture may be greatly improved. Further, in an embodiment, processing temperatures may relatively low, making CES devices easier to process. Also, performance for a CES device may be extremely quick as compared to prior and/or conventional memory technologies due to switch events occurring in distances less than a Thomas Fermi screening length, for example. Additionally, the lack of a filament such as may be formed in some resistive memory technologies may lead to improved performance and/or reliability. Of course, these are merely example advantages that a CES device may have over prior and/or conventional memory technologies, and claimed subject matter is not limited in scope in these respects.

Figure 13:
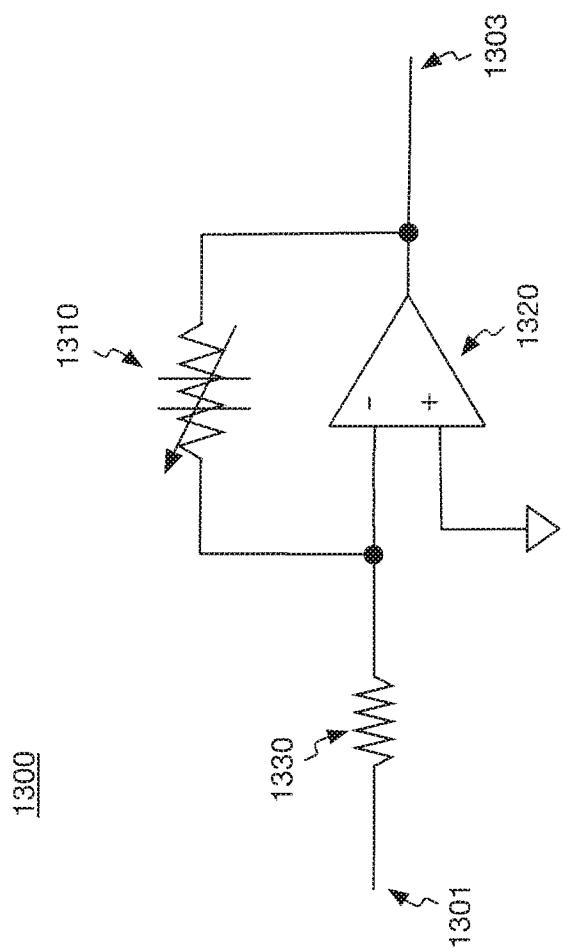
FIG. 13 is a schematic diagram of an example low-pass filter circuit including a correlated electron switch device, in accordance with an embodiment.

FIG. 13 is a schematic diagram depicting an example active low-pass filter 1300 comprising a variable impeder device 1310 in a feedback path of an operational amplifier 1320. In an embodiment, variable impeder device 1310 may be switched between two or more impedance states, thereby altering amplification characteristics of operational amplifier 1320 and/or frequency response characteristics of an output signal at node 1303 in reference to an input signal received at node 1301 through resistor 1330. In an embodiment, the variable capacitance characteristics of a variable impeder device, such as variable impeder device 1310, may provide a variable higher-frequency roll-off aspect to low-pass filter 1300. That is, by altering the capacitance characteristics of variable impeder device 1310 through switching between two or more distinct impedance states, the frequency response low-pass filter 1300 may be altered. Of course, claimed subject matter is not limited in scope in these respects.

Although variable impeder devices are described herein as being implemented in example memory and/or low-pass filter circuits, claimed subject matter is not limited in scope in this respect. Embodiments in accordance with claimed subject matter may implement variable impeder devices in any electronic circuit, whether currently existing or to exist in the future, for example that may benefit from the variable resistance and/or variable capacitance characteristics of a variable impeder device.

As described previously, in an embodiment, a voltage may be applied to a CEM of a CES device. Also, in an embodiment, at least one of a current density and/or a current within the CEM may be measured, and an impedance state of the CES dependent on the measured current and/or current density may be determined. In an embodiment, the impedance state may be dependent on a combination of a capacitance and a resistance of the CEM. Further, in an embodiment, the impedance state may comprise one of a plurality of impedance states, wherein a first of the plurality of impedance states has a lower impedance than a second of the plurality of impedance states. In an embodiment, the first impedance state may have a lower resistance and a lower capacitance, and the second impedance state may have a higher resistance and a higher capacitance. Additionally, in an embodiment, a ratio of impedances of the plurality of impedance states may be proportional to a physical property of the CEM. The physical property of the CEM may include, for example, a Thomas Fermi screening length and/or a Bohr radius. Also, in an embodiment, individual impedance states of the plurality of impedance states may be associated with a data value. Further, a difference in current between the first impedance state and the second impedance state at a determined voltage may provide an indication of a read window, in an embodiment.

As also described previously, in an embodiment, a plurality of electrons may be provided to a CEM of a CES device such that the CES enters a first impedance state, and a plurality of holes may be provided to the CEM such that the CES enters a second impedance state. Also, in an embodiment, the plurality of electrons may cause a voltage across the CEM to be greater than a set voltage threshold, and the plurality of holes may cause the voltage across the CEM to be equal to or greater than a reset voltage threshold. Additionally, the voltage across the CEM may cause a current density in the CEM to be equal to or greater than a set current density and/or a set current, and the voltage across the CEM may cause the current density in the CEM to be equal to or greater than a reset current density and/or a reset current, in an embodiment. Further, in an embodiment, a set voltage across the CEM and a set current density through the CEM may be exceeded, and a reset voltage across the CEM and a reset current density through the CEM may be exceeded, in an embodiment. Also, in an embodiment, individual impedance states may be associated with a data value. Additionally, at least one of the reset voltage, the set voltage, and a difference between the set voltage and the reset voltage may be proportional to a physical property of the CEM, wherein the physical property of the CEM may include at least one of a strong electron potential due to localization and/or a correlation of the electrons, in an embodiment. Further, in an embodiment, the difference between the set voltage and the reset voltage may provide an indication of a size of at least one of a write window and/or a programming window.

In a further embodiment, as described previously, a plurality of electrons may be provided to a CEM of a CES device such that a current and/or current density within the CEM exceeds a first threshold and a voltage across the CEM exceeds a second threshold. Further, in an embodiment, switching from a first impedance state to a second impedance state may result from the current and/or current density exceeding the second threshold. The first impedance state may have a higher resistance and a higher capacitance, and the second impedance state has a lower resistance and a lower capacitance, in an embodiment. Additionally, the first threshold may be dependent on at least one of a current and/or current density required to enable a Mott transition in the CEM, a voltage required to inject electrons over a metal insulator barrier within the CEM, and/or a voltage greater or equal to twice the band-splitting potential, in an embodiment.

An another embodiment, a plurality of electrons may be provided to a CEM of a CES device such that a concentration of electrons within the CEM exceeds a threshold, and a switching from a first impedance state to a second impedance state may occur as a result of the concentration of electrons exceeding the threshold for a Mott transition. Further, in an embodiment, at least one of the plurality of electrons may be recombined with at least one of a plurality of holes within the CEM to enable the switching from the first impedance state to the second impedance state. In an embodiment, the concentration of the plurality of electrons and/or holes may be dependent at least in part on at least one physical property associated with the CEM. The at least one physical property may include, for example the Bohr radius. Further, in an embodiment, the threshold may be dependent at least in part on a current and/or current density required to enable the Mott transition. Also, in an embodiment, a resistance and/or capacitance (or impedance) of the CEM may be substantially different, such as as a result of the Mott transition, for example. Additionally, a switching from the first impedance state to the second impedance state may be caused by a disproportionation reaction, in an embodiment.

As discussed above, a CEM of a CES device may be provided with a plurality of holes such that a concentration of holes within the CEM exceeds a threshold, and switching from a first impedance state to a second impedance state may occur as a result of the concentration of holes exceeding the threshold, in an embodiment. The first impedance state may comprise a lower resistance, lower capacitance state, and the second impedance state may comprise a higher resistance, higher capacitance state, for example. Also, in an embodiment, the threshold may depend, at least in part, on at least one of a current and/or current density required to enable a Mott-like transition within the CEM, and/or a voltage greater or equal to the band-splitting potential. Additionally, in an embodiment, the threshold may be dependent on a current and/or currently density required to enable a Mott-like transition. In an embodiment, at least one of the plurality of holes may be recombined with a respective at least one of a plurality of electrons within the CEM to enable switching from the first impedance state to the second impedance state. Also, a concentration of the plurality of electrons and/or holes may be dependent at least in part on at least one physical property associated with the CEM. The at least one physical property may include, for example, a Thomas Fermi screening length. Further, in an embodiment, the switching from the first impedance state to the second impedance state may be caused by a disproportionation reaction. Also, in an embodiment, resistance and/or capacitance of the CEM may be substantially different, such as between the first impedance state and the second impedance state, for example.

As also discussed previously, a variable impeder device may comprise a CEM capable of operating in a first impedance state and a second impedance state. In an embodiment, the first impedance state may comprise a lower resistance, lower capacitance state, and the second impedance state may comprise a higher resistance, higher capacitance state. Also, in an embodiment, a change in the capacitance may be dependent on at least one material property associated with the CEM. In an embodiment, the CEM may comprises one or more of: one or more transition metal oxides, one or more rare earth oxides, one or more oxides of one or more f-block elements of the periodic table, one or more rare earth transitional metal oxide perovskites, yttrium, and/or ytterbium. Additionally, in an embodiment, a transition from the first impedance state to the second impedance state of the variable impeder device may depend at least in part on an applied critical bias and a critical current/current density.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
   initiating a first transition of a correlated electron switch device from a second impedance state to a first impedance state including achieving a previously established first particular threshold current density level in the correlated electron switch device; and
   initiating a transition of the correlated electron switch device from the first impedance state to the second impedance state including adjusting the signal applied to the current source device coupled to the correlated electron switch device at least in part to dynamically establish a second particular threshold current density level in the correlated electron switch device for a second transition of the correlated electron switch device from the second impedance state to the first impedance state, wherein the second particular threshold current density level for the second transition of the correlated electron switch device from the second impedance state to the first impedance state differs from the first particular threshold current density level for the first transition of the correlated electron switch device from the second impedance state to the first impedance state.

2. The method of claim 1, wherein the first impedance state comprises a relatively higher impedance state and wherein the second impedance state comprises a relatively lower impedance state.

3. The method of claim 1, wherein the first impedance state includes first particular resistance and capacitance characteristics, wherein the second impedance state includes second particular resistance and capacitance characteristics, and wherein a capacitance of the first impedance state exceeds a capacitance of the second impedance state.

4. The method of claim 1, wherein the initiating the transition of the correlated electron switch device from the first impedance state to the second impedance state includes applying a voltage across a serial combination of the current source device and the correlated electron switch device, wherein a level of the voltage across the correlated electron switch device comprises a level of the voltage across the serial combination less a voltage drop across the current source device.

5. The method of claim 4, wherein the initiating the transition of the correlated electron switch device from the first impedance state to the second impedance state includes controlling a current through the current source device at least in part via the signal applied to the current source device.

6. The method of claim 5, wherein the adjusting the signal applied to the current source device includes controlling the current through the current source device to a specified compliance current level at least in part to establish the second particular threshold current density level for the second transition the correlated electron switch device from the second impedance state to the first impedance state.

7. The method of claim 4, wherein the current source device comprises a diode.

8. The method of claim 4, wherein the current source device comprises a transistor, and wherein the voltage applied across the serial combination is applied to a first terminal of the transistor and wherein a second terminal of the transistor is electrically coupled to the correlated electron switch device.

9. The method of claim 8, wherein the adjusting the signal applied to the current source device includes applying the signal to a third terminal of the transistor, wherein the current through the transistor is proportional at least in part to a level of the signal applied to the third terminal.

10. An apparatus, comprising:
    a correlated electron switch device; and
    a current source device coupled to the correlated electron switch device;
    wherein the correlated electron switch device to transition from a second impedance state to a first impedance state responsive at least in part to an adjustment of a signal applied to the current source device to achieve a previously established first particular threshold current density level in the correlated electron switch device;
    wherein the correlated electron switch device to transition from the first impedance state to the second impedance state responsive at least in part to a further adjustment of the signal applied to the current source device, wherein the current source device further to, responsive at least in part to the further adjustment of the signal applied to the current source device, dynamically establish a second particular threshold current density level in the correlated electron switch device for a subsequent operation to transition the correlated electron switch device from the second impedance state to the first impedance state, wherein the second particular threshold current density level to differ from the first particular threshold current density level.

11. The apparatus of claim 10, wherein the first impedance state to comprise a relatively higher impedance state and the second impedance state to comprise a relatively lower impedance state.

12. The apparatus of claim 11, wherein the first impedance state to include first particular resistance and capacitance characteristics, wherein the second impedance state has second particular resistance and capacitance characteristics, and wherein a capacitance of the first impedance state to exceed a capacitance of the second impedance state.

13. The apparatus of claim 10, wherein the correlated electron switch device to transition from the first impedance state to the second impedance state responsive at least in part to an application of a voltage across a serial combination of the current source device and the correlated electron switch device, wherein a level of the voltage across the correlated electron switch device to comprise a level of the voltage across the combination less a voltage drop across the current source device.

14. The apparatus of claim 13, wherein the current source device to limit the current density in the correlated electron switch device at least in part via control of a current in the current source device responsive at least in part to the signal applied to the current source device.

15. The apparatus of claim 14, wherein the current in the current source device to be controlled to achieve a specified compliance current level at least in part to establish the second particular threshold current density level for the subsequent operation to transition the correlated electron switch device from the second impedance state to the first impedance state.

16. The apparatus of claim 13, wherein the current source device to comprise a diode.

17. The apparatus of claim 14, wherein the current source device to comprise a transistor, and wherein the application of the voltage across the serial combination to include application of the voltage to a first terminal of the transistor and wherein a second terminal of the transistor to be electrically connected to the correlated electron switch device.

18. The apparatus of claim 17, wherein, to control the current in the current source, the signal applied to the current source device to be applied to a third terminal of the transistor, wherein a current through the transistor to be proportional at least in part to a level of the signal applied to the third terminal of the transistor.

* * * * *